(12) United States Patent  (10) Patent No.: US 8,795,949 B2
Kozawa et al.  (45) Date of Patent: Aug. 5, 2014

(54) RESIST PATTERN IMPROVING MATERIAL, METHOD FOR FORMING RESIST PATTERN, AND METHOD FOR PRODUCING SEMICONDUCTOR DEVICE

(75) Inventors: Miwa Kozawa, Kawasaki (JP); Koji Nozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 151 days.

(21) Appl. No.: 13/242,206

(22) Filed: Sep. 23, 2011

(65) Prior Publication Data

US 2012/0156879 A1  Jun. 21, 2012

(30) Foreign Application Priority Data

Dec. 16, 2010  (JP) .................. 2010-280849
Mar. 4, 2011  (JP) .................. 2011-047718

(51) Int. Cl.
*G03F 7/00* (2006.01)
*G03F 7/004* (2006.01)
*G03F 7/40* (2006.01)

(52) U.S. Cl.
USPC .............. 430/273.1; 430/270.1; 430/313; 430/330; 430/331

(58) Field of Classification Search
None
See application file for complete search history.

(56) References Cited

U.S. PATENT DOCUMENTS 5,273,677 A * 12/1993 Arif .................. 510/514
5,612,305 A   3/1997 Lewis
6,319,809 B1 * 11/2001 Chang et al. ............. 438/597

(Continued)

FOREIGN PATENT DOCUMENTS

CN  1821871  8/2006
EP  1 429 185 A1  6/2004

(Continued)

OTHER PUBLICATIONS

Machine translation of JP 2004-233516 (no date).*

(Continued)

*Primary Examiner* — Amanda C. Walke
(74) *Attorney, Agent, or Firm* — Kratz, Quintos & Hanson, LLP

(57) ABSTRACT

To provide a resist pattern improving material, containing: a compound represented by the following general formula (1), or a compound represented by the following general formula (2), or both thereof; and water:

General Formula (1)

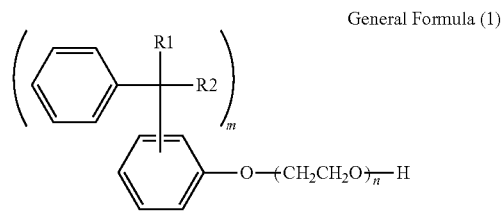

where R1 and R2 are each independently a hydrogen atom, or a C1-C3 alkyl group;
m is an integer of 1 to 3; and n is an integer of 3 to 30, General Formula (2)

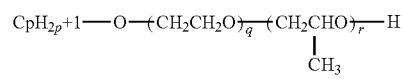

where p is an integer of 8 to 20; q is an integer of 3 to 30; and r is an integer of 1 to 8.

19 Claims, 5 Drawing Sheets

(56) References Cited

U.S. PATENT DOCUMENTS

| | | | |
|---|---|---|---|
| 6,555,607 B1 | 4/2003 | Kanda | |
| 6,566,040 B1 | 5/2003 | Sugino | |
| 6,579,657 B1 | 6/2003 | Ishibashi | |
| 6,673,760 B1 * | 1/2004 | Lentsch et al. | 510/221 |
| 6,878,615 B2 * | 4/2005 | Tsai et al. | 438/618 |
| 6,900,003 B2 * | 5/2005 | Anzures et al. | 430/331 |
| 6,919,278 B2 * | 7/2005 | Kang et al. | 438/706 |
| 7,150,960 B2 * | 12/2006 | Chen | 430/311 |
| 7,416,837 B2 * | 8/2008 | Nozaki et al. | 430/314 |
| 7,591,270 B2 | 9/2009 | Zhang | |
| 7,662,539 B2 * | 2/2010 | Nozaki et al. | 430/273.1 |
| 7,799,508 B2 * | 9/2010 | Nozaki et al. | 430/270.1 |
| 8,129,092 B2 * | 3/2012 | Kozawa et al. | 430/313 |
| 8,183,309 B2 * | 5/2012 | Ichikawa et al. | 523/166 |
| 8,338,356 B2 * | 12/2012 | Mu et al. | 510/421 |
| 8,420,288 B2 * | 4/2013 | Nozaki et al. | 430/270.1 |
| 2003/0098464 A1 | 5/2003 | Kon | |
| 2003/0175624 A1 | 9/2003 | Nozaki | |
| 2004/0029047 A1 | 2/2004 | Ishibashi | |
| 2004/0072098 A1 | 4/2004 | Kozawa | |
| 2006/0188805 A1 * | 8/2006 | Nozaki et al. | 430/270.1 |
| 2006/0188807 A1 * | 8/2006 | Nozaki et al. | 430/270.1 |
| 2006/0194154 A1 * | 8/2006 | Chen et al. | 430/331 |
| 2007/0010409 A1 | 1/2007 | Zhang | |
| 2007/0010412 A1 | 1/2007 | Zhang | |
| 2008/0073322 A1 * | 3/2008 | Nozaki et al. | 216/49 |
| 2009/0226844 A1 * | 9/2009 | Nozaki et al. | 430/296 |
| 2010/0003468 A1 | 1/2010 | Noya | |
| 2010/0304313 A1 | 12/2010 | Zhang | |

FOREIGN PATENT DOCUMENTS

| | | | |
|---|---|---|---|
| JP | 62-65326 | | 3/1987 |
| JP | 5-197151 | | 8/1993 |
| JP | 05214391 A | * | 8/1993 |
| JP | 9-260265 | | 10/1997 |
| JP | 10-73927 | | 3/1998 |
| JP | 11-204399 | | 7/1999 |
| JP | 11-283910 | | 10/1999 |
| JP | 2000-58506 | | 2/2000 |
| JP | 2000-267268 | | 9/2000 |
| JP | 2000-298356 | | 10/2000 |
| JP | 2000-347414 | | 12/2000 |
| JP | 2001-19860 | | 1/2001 |
| JP | 2001-33984 | | 2/2001 |
| JP | 2001-228616 A1 | | 8/2001 |
| JP | 3237082 B2 | | 10/2001 |
| JP | 2002-6491 A1 | | 1/2002 |
| JP | 2002-6498 A1 | | 1/2002 |
| JP | 2002-6512 A1 | | 1/2002 |
| JP | 2002-23366 A1 | | 1/2002 |
| JP | 2002-49161 A1 | | 2/2002 |
| JP | 2003-84457 A1 | | 3/2003 |
| JP | 2003-131400 A1 | | 5/2003 |
| JP | 2003-162060 A1 | | 6/2003 |
| JP | 2003-255564 A1 | | 9/2003 |
| JP | 2004-53723 A1 | | 2/2004 |
| JP | 2004-86203 A1 | | 3/2004 |
| JP | 2004-126080 A1 | | 4/2004 |
| JP | 2004233516 A | * | 8/2004 |
| JP | 2004-264373 A1 | | 9/2004 |
| JP | 3633595 B2 | | 1/2005 |
| JP | 2005-91415 A1 | | 4/2005 |
| JP | 2005-208365 A1 | | 8/2005 |
| JP | 2006-201809 A1 | | 8/2006 |
| JP | 2006-259692 A1 | | 9/2006 |
| JP | 2007-213013 A1 | | 8/2007 |
| JP | 2008-3323 A1 | | 1/2008 |
| JP | 2010-49247 A1 | | 3/2010 |
| WO | WO 2004/074941 A1 | | 9/2004 |

OTHER PUBLICATIONS

Machine translation of JP 05-214391 (no date).*

First Notification of Office Action issued Jan. 14, 2013 from the State Intellectual Property Office of the People's Republic of China in counterpart application No. 201110314398.2 with English translation (15 pages).

T. Ishibashi, et al.; "Advanced Micro-Lithography Process with Chemical Shrink Technology;" Jpn. J. Appl. Phys.; vol. 40; Part 1; No. 1; Jan. 2001; pp. 419-425.

M. Terai, et al.; "Below 70-nm Contact Hole Pattern with RELACS Process on ArF Resist;" Proceedings of SPIE; vol. 5039; 2003; pp. 789-797.

Taiwanese Office Action issued for Taiwan Patent Application No. 100134966 dated Dec. 12, 2013.

* cited by examiner

RESIST PATTERN IMPROVING MATERIAL, METHOD FOR FORMING RESIST PATTERN, AND METHOD FOR PRODUCING SEMICONDUCTOR DEVICE

CROSS-REFERENCE TO RELATED APPLICATIONS

This application is based upon and claims the benefit of priority of the prior Japanese Patent Application No. 2010-280849, filed on Dec. 16, 2010, and Japanese Patent Application No. 2011-047718, filed on Mar. 4, 2011, the entire contents of which are incorporated herein by reference.

FIELD

The embodiments discussed herein relate to a resist pattern improving material, a method for forming a resist pattern, and a method for producing a semiconductor device.

BACKGROUND

To further improve integration degrees of semiconductors such as of a large scale integration (LSI), it is desired to make finer patterns during productions of semiconductors, and currently the smallest pattern size is 100 nm or shorter.

Formations of such fine patterns in semiconductor devices have been realized by shortening wavelength of light from a light source of exposure devices and improving resist materials. Currently, formations of fine patterns have been performed by a liquid immersion lithography, in which exposure is performed through water with a light source that emits argon fluoride (ArF) excimer laser light having a wavelength of 193 nm, and as a resist material used for the lithography, various ArF resist materials, which use acrylic resins as a base, have been developed. Moreover, as a lithography technique of the next generation, extreme ultraviolet (EUV) lithography using as a light source, soft X rays having a wavelength of 13.5 nm has been studied, and therefore it is obvious that a pattern size will continue to be reduced, e.g. 30 nm or shorter, in the future.

Along with the above-mentioned reduction of the pattern size, unevenness of a resist pattern line width, i.e. line width roughness (LWR), of the resist pattern has become more significant, and this may adversely affect performances of a resulting device.

To solve the problems as mentioned, there are attempts to optimize exposure devices and resist materials for use. However, satisfactory results have not been obtained. Moreover, it takes a great deal of cost and time to improve exposure devices and resist materials.

Accordingly, various countermeasures have been studied and provided in terms of process conditions.

For example, the method of improving LWR is disclosed, and in this method, a resist pattern is treated with an aqueous solution containing an ionic surfactant in a rinsing process, which is performed after a developing process, so as to dissolve the roughness of the resist pattern at the same time as reducing defects (e.g. defects including residues, and deformation of the pattern) caused by the developing process (Japanese Patent Application Laid-Open (JP-A) No. 2007-213013).

Moreover, another method is disclosed in JP-A No. 2010-49247, and in this method an organic coating material, to which a low molecular acidic compound containing a carboxyl group, is applied to a resist pattern that has been developed, and the coating material is then removed to thereby improve LWR as well as sliming the resist pattern (see JP-A No. 2010-49247).

However, any of these methods has a problem that a desirable resist pattern size cannot be obtained as the improvement of LWR is realized by removing a surface of a resist pattern by processing. Moreover, these methods have a problem that LWR may be potentially worsened.

The present inventors have disclosed a resist pattern thickening material that enables precise processing by swelling (thickening) the resist pattern (Japanese Patent (JP-B) No. 3633595, and JP-A No. 2006-259692).

In the case where a resist pattern is subjected to a thickening process using such resist pattern thickening material, however, a size of the resist pattern is largely changed. Therefore, it is not suitable for a material for improving LWR, which desirably improves LWR of a resist pattern, without changing a size of the resist pattern more than necessary.

Accordingly, it is currently desired to provide a resist pattern improving material, a method for forming a resist pattern, and a method for producing a semiconductor device, that can improve LWR of a resist pattern without changing a size thereof more than necessary.

SUMMARY

The disclosed resist pattern improving material contains; a compound represented by the following general formula (1), or a compound represented by the following general formula (2), or both thereof; and water:

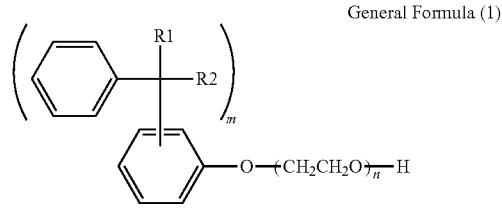

General Formula (1)

where R1 and R2 are each independently a hydrogen atom, or a C1-C3 alkyl group;
m is an integer of 1 to 3; and n is an integer of 3 to 30,

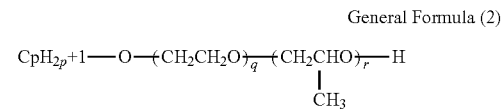

General Formula (2)

where p is an integer of 8 to 20; q is an integer of 3 to 30; and r is an integer of 1 to 8.

The disclosed method for forming a resist pattern contains: after forming a resist pattern, applying the disclosed resist pattern improving material so as to cover a surface of the resist pattern.

The disclosed method for producing a semiconductor device contains: after forming a resist pattern on a processing surface, applying the disclosed resist pattern improving material so as to cover a surface of the resist pattern to thereby improve the resist pattern; and etching the processing surface using the improved resist pattern as a mask so as to pattern the processing surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

Figure 1A:
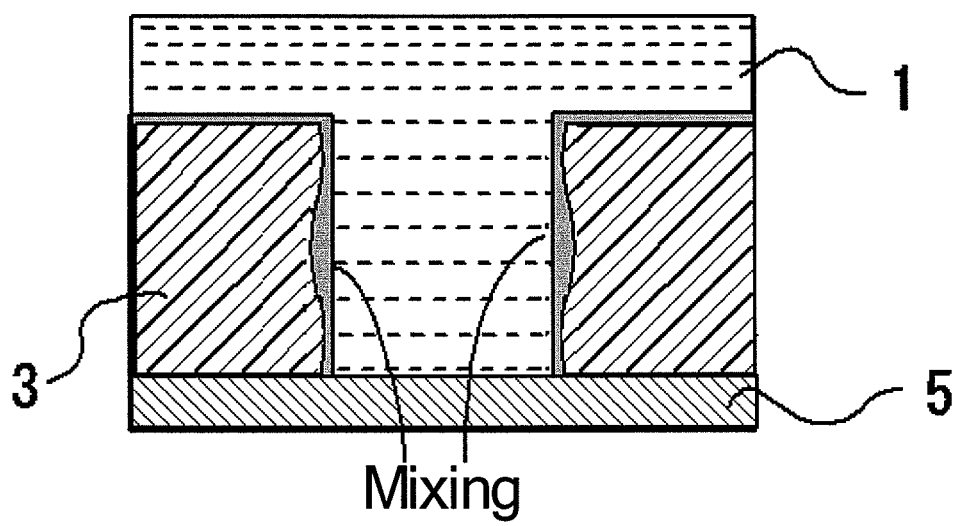
FIG. 1A is a diagram for explaining a mechanism for improving (reducing) LWR of a resist pattern using the resist pattern improving material of the invention, and illustrates the state where the resist pattern improving material is applied to a surface of the resist pattern.

DESCRIPTION OF EMBODIMENTS (Resist Pattern Improving Material)

The resist pattern improving material contains at least a compound represented by the general formula (1), and/or a compound represented by the general formula (2), and water, and may further contain other substances, such as a water-soluble resin, and a water-soluble compound containing an aromatic group and having a molecular weight of 200 or smaller, if necessary.

<Compound Represented by General Formula (1) and Compound Represented by General Formula (2)>

The resist pattern improving material contains a compound represented by the following general formula (1), or a compound represented by the following general formula (2), or both thereof.

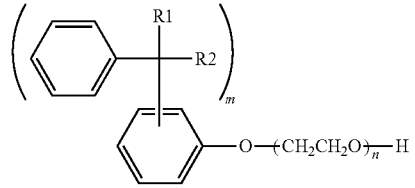

General Formula (1)

In the general formula (1), R1 and R2 are each independently a hydrogen atom, or a C1-C3 alkyl group; m is an integer of 1 to 3; and n is an integer of 3 to 30.

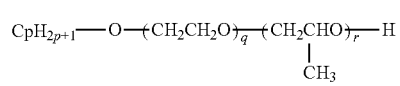

General Formula (2)

In the general formula (2), p is an integer of 8 to 20; q is an integer of 3 to 30; and r is an integer of 1 to 8.

These may be used independently, or in combination.

Note that, in a molecule of the compound represented by the general formula (2), the units —($CH_2CH_2O$)—, and —($CH_2CH(CH_3)O$)— may be arranged to form a random copolymer, or a block copolymer.

In the general formula (1), R1 and R2 are appropriately selected depending on the intended purpose without any restriction, but they are preferably each independently a hydrogen atom, or a methyl group, in view of the water-solubility of the resulting resist pattern improving material.

In the general formula (2), the alkyl group represented by $C_pH_{2p+1}$ is appropriately selected depending on the intended purpose without any restriction, but it is preferably a branched alkyl group in view of the obtainable reactivity with a wide range of resist materials.

An amount of the compound represented by the general formula (1) and/or the compound represented by the general formula (2) is appropriately selected depending on the intended purpose without any restriction. The amount thereof is preferably 0.0005 parts by mass to 1 part by mass, more preferably 0.0008 parts by mass to 0.5 parts by mass, and even more preferably 0.001 parts by mass to 0.1 parts by mass, relative to 100 parts by mass of water. When the amount thereof is smaller than 0.0005 parts by mass, the resulting resist pattern improving material may not have a sufficient effect of improving the LWR. When the amount thereof is greater than 1 part by mass, the resulting resist pattern improving material may have poor coating ability. When the amount thereof is within the even more preferable range mentioned above, the LWR is much improved and therefore it is advantageous.

<Water>

The water is appropriately selected depending on the intended purpose without any restriction, but it is preferably pure water (deionized water).

An amount of the water is appropriately adjusted depending on the intended purpose without any restriction, but it is preferably 90 parts by mass or more relative to 100 parts by mass of the resist pattern improving material, for obtaining the desirable coating ability.

<Water-Soluble Resin>

Since the resist pattern improving material contains the water-soluble resin, the resist pattern improving material can improve the LWR of the resist pattern as well as thickening the resist pattern.

The water-soluble resin is appropriately selected depending on the intended purpose without any restriction. Examples thereof include polyvinyl alcohol, polyvinyl acetal, polyvinyl acetate, polyacrylic acid, polyvinyl pyrrolidone, polyethylene imine, polyethylene oxide, a styrene-maleic acid copolymer, polyvinyl amine, polyallyl amine, an oxazoline group-containing water-soluble resin, a water-soluble melamine resin, a water-soluble urea resin, an alkyd resin, a sulfone amide resin, cellulose, tannin, polyglutamic acid, and resins containing any of the preceding resins at least in part thereof. These may be used independently or in combination.

Among them, polyvinyl alcohol, polyvinyl acetal, polyvinyl acetate, polyvinyl pyrrolidone, and the resins containing any of the preceding resins at least in part thereof are preferable in view of their stability.

The water solubility of the water-soluble resin is appropriately adjusted depending on the intended purpose. For example, such the water solubility is preferable that 0.1 g or more of the water-soluble resin is dissolved in 100 g of water at 25° C.

An amount of the water-soluble resin is appropriately adjusted depending on the intended purpose without any restriction, but it is preferably 0.001 parts by mass to 10 parts by mass, more preferably 0.05 parts by mass to 4 parts by mass, relative to 100 parts by mass of the water. When the amount of the water-soluble resin is less than 0.001 parts by mass, the resulting resist pattern improving material may not have an effect of thickening a resist pattern at all. When the amount thereof is more than 10 parts by mass, although the resulting resist pattern improving material improves the LWR, the effect of thickening a resist pattern is excessively large, and therefore a resist pattern of the desired size may not be obtained. When the amount of the water-soluble resin is within the more preferable range mentioned above, the resulting resist pattern improving material can reduce roughness of side walls of a resist pattern with thickening the resist pattern within a desirable range, without excessively changing the size of the resist pattern to thereby improve the evenness of the resist pattern width (i.e. improving LWR).

<Water-Soluble Compound Containing Aromatic Group and having Molecular Weight of 200 or Smaller>

By adding a water-soluble compound containing an aromatic group and having a molecular weight of 200 or smaller to the resist pattern improving material, the resulting resist pattern improving material can improve the LWR of the resist pattern regardless of the size of the resist pattern, as well as uniformly thickening the resist pattern.

The water-soluble compound containing an aromatic group and having a molecular weight of 200 or smaller is appropriately selected depending on the intended purpose without any restriction. Examples thereof include mandelic acid, phenylalanine, phenylglycine, phenyl lactate, 2-hydroxybenzyl alcohol, 3-hydroxybenzyl alcohol, and 4-hydroxybenzyl alcohol. These may be used independently, or in combination.

Among them, 2-hydroxybenzyl alcohol, 3-hydroxybenzyl alcohol, 4-hydroxybenzyl alcohol, and phenyl lactate are preferable in view of the water-solubility.

The water-solubility of the water-soluble compound containing an aromatic group and having a molecular weight of 200 or smaller is appropriately selected depending on the intended purpose without any restriction. The water-solubility thereof is preferably such that 0.1 g or more of the water-soluble compound containing an aromatic group and having a molecular weight of 200 or smaller is dissolved in 100 g of water at 25° C.

An amount of the water-soluble compound containing an aromatic group and having a molecular weight of 200 or smaller is appropriately adjusted depending on the intended purpose without any restriction. The amount thereof is preferably 0.001 parts by mass to 5 parts by mass, more preferably 0.005 parts by mass to 1 part by mass, relative to 100 parts by mass of the water. When the amount thereof is smaller than 0.001 parts by mass, the resulting resist pattern improving material may not have an effect of thickening a resist pattern at all. When the amount thereof is greater than 5 parts by mass, although the resulting resist pattern improving material improves the LWR, the effect of thickening a resist pattern is excessively large, and therefore a resist pattern of the desired size may not be obtained. When the amount thereof is within the more preferable range mentioned above, the resulting resist pattern improving material can reduce roughness of side walls of a resist pattern with thickening the resist pattern within a desirable range, without excessively changing the size of the resist pattern to thereby improve the evenness of the resist pattern width (i.e. improving LWR).

<Other Substances>

Other substances are appropriately selected depending on the intended purpose without any restriction, and examples thereof include an organic solvent, and various additives known in the art (e.g. quenchers such as an amine quencher, an amide quencher, and ammonium chloride).

Each amount of other substances is not particularly restricted, and is appropriately adjusted depending on the types, or amounts of the compound represented by the general formula (1), the compound represented by the general formula (2), the water-soluble resin, and the water-soluble compound containing an aromatic group and having a molecular weight of 200 or smaller.

—Organic Solvent—

By adding an organic solvent to the resist pattern improving material, the solubility of the compound represented by the general formula (1), compound represented by general formula (2), water-soluble resin, and other substances improve.

The organic solvent is appropriately selected depending on the intended purpose without any restriction, and examples thereof include an alcohol organic solvent, a chain ester organic solvent, a cyclic ester organic solvent, a ketone organic solvent, a chain ether organic solvent, and a cyclic ether organic solvent.

The alcohol organic solvent is appropriately selected depending on the intended purpose without any restriction, and examples thereof include methanol, ethanol, propyl alcohol, isopropyl alcohol, and butyl alcohol.

The chain ester organic solvent is appropriately selected depending on the intended purpose without any restriction, and examples thereof include ethyl lactate, and propylene glycol methyl ether acetate (PGMEA).

The cyclic ester organic solvent is appropriately selected depending on the intended purpose without any restriction, and examples thereof include a lactone organic solvent such as γ-butyrolactone.

The ketone organic solvent is appropriately selected depending on the intended purpose without any restriction, and examples thereof include a ketone organic solvent such as acetone, cyclohexanone, and heptanone.

The chain ether organic solvent is appropriately selected depending on the intended purpose without any restriction, and examples thereof include ethylene glycol dimethyl ether.

The cyclic ether organic solvent is appropriately selected depending on the intended purpose without any restriction, and examples thereof include tetrahydrofuran, and dioxane.

These organic solvents may be used independently, or in combination.

Among them, the organic solvents having the boiling point of 80° C. to 200° C. are preferable as they contribute to the effective reduction in roughness of a resist pattern.

The form of the resist pattern improving material is appropriately selected depending on the intended purpose without any restriction, and examples thereof include an aqueous solution, a colloid solution, and an emulsion. Among them, the aqueous solution is preferable in view of its coating ability.

<Use and the Like>

The resist pattern improving material can be used by applying the resist pattern improving material to a resist pattern.

The resist pattern improving material is applied onto the resist pattern so as to allow the resist pattern improving material to interact (mix) with the resist pattern, and as a result, a layer (a mixing layer) formed by the interaction between the resist pattern improving material and the resist pattern is formed at the surface of the resist pattern. The formation of the mixing layer reduces the roughness of the side walls of the resist pattern, so that a resist pattern whose LWR has been improved is formed.

As a result of the reduction in the roughness of the side walls of the resist pattern with the resist pattern improving material, the uniformity of the line width of the resist pattern is improved compared with that before the reduction of the roughness, i.e., unevenness of the line width of the resist pattern (line width roughness (LWR)) is improved. As a result of the improved LWR, a highly precise resist pattern is formed by extending the exposure limit (dissolution limit) of a light source of an exposure device used for the patterning of the resist pattern (smaller than the size of the opening and/or pattern pitch which can be patterned by a wavelength of the light of the light source).

Moreover, in the case where the resist pattern improving material further contains the water-soluble resin and/or the water-soluble compound containing an aromatic group and having a molecular weight of 200 or smaller, as well as the compound represented by the general formula (1) and/or the compound represented by the general formula (2), such the resist pattern improving material thickens a resist pattern at the same time as reducing the roughness of the side walls of the resist pattern. By thickening the resist pattern, the roughness of the side walls of the resist pattern is reduced even more.

The reduction rate of the roughness of the side walls of the resist pattern, uniformity of the width of the resist pattern, and thickened amount of the resist pattern can be controlled in the desirable ranges by appropriately adjusting the amounts of the compound represented by the general formula (1), the compound represented by the general formula (2), the water-soluble resin, and the water-soluble compound containing an aromatic group and having a molecular weight of 200 or smaller for use in the resist pattern improving material, as well as the viscosity, applied thickness, baking temperature, and baking duration of the resist pattern improving material, and the like.

—Material of Resist Pattern—

The material of the resist pattern (i.e. a resist pattern to which the resist pattern improving material is applied) is appropriately selected from resist materials known in the art depending on the intended purpose without any restriction, and it may be any of negative or positive. Examples thereof include resists that can be patterned by g-line, i-line, KrF excimer laser light, ArF excimer laser light, $F_2$ excimer laser light, an electron beam and the like, such as a g-line resist, an i-line resist, a KrF resist, an ArF resist, a $F_2$ resist, an electron beam resist, and the like. These may be of chemically amplified, or of chemically non-amplified. Among them, a KrF resist, an ArF resist, a resist containing an acrylic resin are preferable. In view of the formation of (inner patterns, and improvement of through-put, the ArF resist, the resolution limit of which have been desired to extend urgently, and/or the resist containing an acrylic resin are more preferable as the material of the resist pattern.

Specific examples of the material for the resist pattern include a novolak-based resist, a PHS-based resist, an acryl-based resist, a cycloolefin-maleic acid anhydride (COMA)-based resist, a cycloolefin-based resist, and a hybrid (alicyclic acryl-COMA copolymer) resist. These may be fluorine-modified, or modified in other manners.

The formation method, size, thickness, and the like of the resist pattern are appropriately selected depending on the intended purpose without any restriction. Especially, the thickness of the resist pattern is appropriately adjusted depending on the processing surface (which is a subject for the process), the etching conditions, and the like, but it is generally approximately 100 nm to approximately 500 nm.

Hereinafter, the manner of reducing the roughness of side walls of the resist pattern using the resist pattern improving material will be explained with reference to the drawings.

Figure 1B:
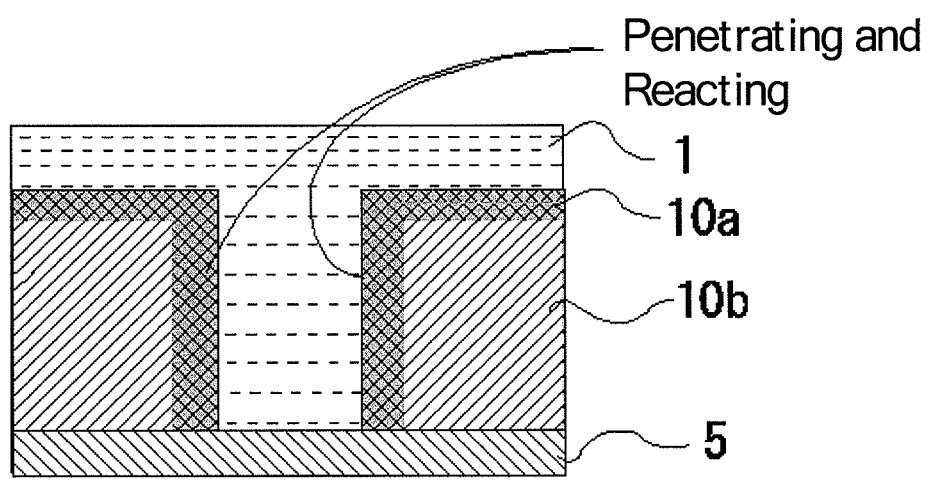
FIG. 1B is a diagram for explaining a mechanism for improving (reducing) LWR of a resist pattern using the resist pattern improving material of the invention, and illustrates the state where the resist pattern improving material is penetrated into the surface of the resist pattern.

As illustrated in FIG. 1A, after forming a resist pattern 3 on a processing surface (of a base) 5, a resist pattern improving material 1 is applied (coated) to a surface of the resist pattern 3 to form a coating film. Thereafter, baking (heating and drying) may be performed, if necessary. As a result, the resist pattern improving material 1 is mixed with the resist pattern 3 (the resist pattern 3 is impregnated with the resist pattern improving material 1) at the interface between the resist pattern 3 and the resist pattern improving material 1, to thereby form a surface layer (a mixing layer) 10a by reacting the mixed (impregnated) portion at an interface between an inner resist pattern 10b (the resist pattern 3) and the resist pattern improving material 1, as illustrated in FIG. 1B. As a result, the roughness of side walls of the inner resist pattern 10b (resist pattern 3) is stably and uniformly reduced regardless of the size of the inner resist pattern 10b (resist pattern 3).

Figure 1C:
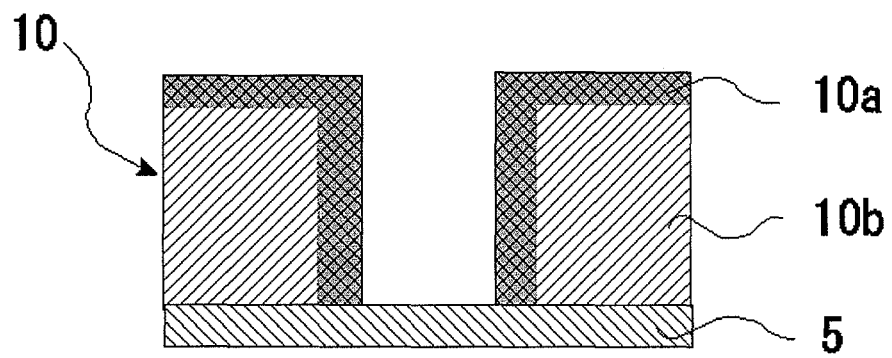
FIG. 1C is a diagram for explaining a mechanism for improving (reducing) LWR of a resist pattern using the resist pattern improving material of the invention, and illustrates the state where the surface of the resist pattern is improved with the resist pattern improving material.

Thereafter, as illustrated in FIG. 1C, the portion of the applied resist pattern improving material 1 where the resist pattern improving material 1 is not interacted (mixed) with the resist pattern 3, and/or the portion of the applied the resist pattern improving material 1 where the interaction (mixing) between the resist pattern improving material 1 and the resist pattern 3 is weak (i.e. highly water-soluble portion) is dissolved and removed by rinsing, to thereby form (develop) a smooth resist pattern 10 in which the roughness of side walls thereof has been reduced.

Note that, the rinsing may be performed with pure water, or an alkaline solution such as a common alkaline developer. Moreover, pure water or an alkaline solution (e.g. an alkaline developer) to which a surfactant is added may be used for rinsing, if necessary. Note that, the rinsing is performed as necessity, and may not be performed.

The resist pattern 10 whose roughness has been reduced contains the surface layer (mixing layer) 10a, which is formed by reacting with the resist pattern improving material 1, on the surface of the inner resist pattern 10b (resist pattern 3). The resist pattern 10 whose roughness has been reduced has the roughness which has been reduced by the portion of the surface layer (mixing layer) 10a, compared to the resist pattern 3. Therefore, the line width roughness (LWR) value thereof, which represents a variation (unevenness) of line widths of a resist pattern formed by the roughness-reduced resist pattern 10, is smaller than the variation of line widths of the resist pattern formed by the resist pattern 3 before the reduction of the roughness. Accordingly, a precise resist pattern can be highly accurately formed by extending the exposure limit (dissolution limit) of the light source of the exposure device used for forming the resist pattern 3.

In the case where the resist pattern improving material 1 contains the water-soluble resin and/or the water-soluble compound containing an aromatic group and having a molecular weight of 200 or smaller, a surface layer (mixing layer) 10a formed with the resist pattern improving material is larger than that formed with the resist pattern improving material without containing the water-soluble resin and/or the water-soluble compound containing an aromatic group and having a molecular weight of 200 or smaller. Since the roughness-reduced resist pattern 10 has a roughness reduced by the portion of the surface layer (mixing layer) 10a compared to the resist pattern 3, and also has been thickened with the resist pattern improving material, the line width roughness (LWR) value thereof, which represents the variation (unevenness) in the line width of the resist pattern formed by the roughness-reduced resist pattern 10, is much smaller than the variation in the line width of the resist pattern 3 before the reduction of the roughness.

The disclosed resist pattern improving material improves LWR by reducing roughness of side walls of a resist pattern, and is suitably used for making the resist pattern precise by extending the exposure limit. Moreover, the disclosed resist pattern improving material is particularly suitably used for the method for producing a semiconductor device, which will be described later, and the like.

(Method for Forming Resist Pattern)

The method for forming a resist pattern contains at least applying the resist pattern improving material (a coating step), preferably further contains a rinsing step, and if necessary, further contains other steps such as an exposure step and a baking step.

<Coating Step>

The coating step is appropriately selected depending on the intended purpose without any restriction, provided that the coating step is, after forming a resist pattern, applying a resist pattern improving material so as to cover a surface of the resist pattern.

The resist pattern can be formed in accordance with any of methods known in the art.

The resist pattern can be formed on a processing surface (of a base). The processing surface (of the base) is appropriately selected depending on the intended purpose without any restriction. In the case where the resist pattern is formed in the course of production of a semiconductor device, examples of the processing surface (of the base) include a surface of a semiconductor substrate. As the semiconductor substrate, substrates such as silicon wafers, and various oxidized films are preferable.

The method for applying the resist pattern improving material is appropriately selected from coating methods known in the art depending on the intended purpose without any restriction. For example, spin coating is preferable.

In the case of the spin coating, the revolution speed thereof is appropriately adjusted depending on the intended purpose without any restriction, but it is preferably 100 rpm to 10,000 rpm, more preferably 500 rpm to 5,000 rpm. The duration for the coating is preferably 1 second to 10 minutes, more preferably 1 second to 90 seconds.

At the time of the application, the applied thickness of the resist pattern improving material is generally approximately 5 nm to approximately 1,000 nm, preferably approximately 10 nm to approximately 100 nm.

Moreover, the resist pattern is generally formed by rinsing with pure water after the developing with the alkaline developer, but the resist pattern formation may be performed by the method using the resist pattern improving material, in which the resist pattern improving material is applied as a rinsing fluid just after the developing with the alkaline developer.

<Rinsing Step>

The rinsing step is appropriately selected depending on the intended purpose without any restriction, provided that it is rinsing the resist pattern, the surface of which has been covered with the resist pattern improving material, with a rinsing fluid.

By performing the rinsing after the application of the resist pattern improving material, a portion where the resist pattern improving material has not been interacted (mixed) with the resist pattern, or a portion where the interaction between the resist pattern improving material and the material of the resist pattern is weak is made dissolved and removed (rinsing processed) so that the resist pattern whose roughness of side walls is reduced can be developed (obtained).

The rinsing fluid is appropriately selected depending on the intended purpose without any restriction, and it may contain pure water, or an alkaline developer. Moreover, the rinsing fluid may further contain a surfactant, but the rinsing fluid is preferably pure water in view of the easiness of the process.

In the case where pure water containing a surfactant or an alkaline solution (an alkaline developer) containing a surfactant is used, uniformity of the thickened effect at the interface between the resist pattern improving material and the resist pattern is improved within the entire processing surface, and the generation of residual substances or defects can be reduced.

The surfactant is appropriately selected depending on the intended purpose without any restriction, but it is preferably a nonionic surfactant as the nonionic surfactant does not contain a metal ion such as a sodium salt, and a potassium salt.

The nonionic surfactant is appropriately selected depending on the intended purpose without any restriction. Examples of the nonionic surfactant include a polyoxyethylene-polyoxypropylene condensate compound, a polyoxyalkylene alkyl ether compound, a polyoxyethylene alkyl ether compound, a polyoxyethylene derivative compound, a silicone compound, a sorbitan fatty acid ester compound, a glycerin fatty acid ester compound, an alcohol ethoxylate compound, and a phenol ethoxylate compound. These may be used independently or in combination. Note that, an ionic surfactant may be also used as long as it is a non-metal salt inonic surfactant.

An amount of the surfactant in the pure water or alkaline solution (e.g. alkaline developer) is appropriately adjusted depending on the intended purpose without any restriction, but it is preferably 0.001% by mass to 1% by mass, more preferably 0.05% by mass to 0.5% by mass.

When the amount thereof is less than 0.001% by mass, the effect obtained from the surfactant is insufficient. When the amount thereof is more than 1% by mass, the solvency of the developer becomes excessive, and thus the developer may dissolve the resist pattern, which increases roughness of the side walls of the resist pattern, as well as generating the residual substances or defects due to the formation of bubbles.

The alkali developer is appropriately selected from alkaline developers conventionally used for the production of a semiconductor device, without any restriction. Preferable examples thereof include a quaternary ammonium hydroxide aqueous solution, and a choline aqueous solution. These may be used independently or in combination. Among them, a tetramethylammonium hydroxide aqueous solution is preferable as it is inexpensive and readily available.

Moreover, to the alkali developer, a surfactant may be optionally added. In this case, an amount of the surfactant in the alkali developer is appropriately adjusted depending on the intended purpose without any restriction, but it is preferably 0.001% by mass to 1% by mass, more preferably 0.05% by mass to 0.5% by mass.

<Other Steps>

Examples of other steps include the exposure step, and the baking step.

—Exposure Step—

The exposure step is applying UV-rays or ionizing radiation to an entire surface of the resist pattern before applying the resist pattern improving material thereto.

Specifically, when the resist pattern having various pitches including the region where the resist pattern is spaced (the region where the resist pattern has a long pitch) and the region where the resist pattern is dense (the region where the resist pattern has a short pitch), or the resist pattern having various sizes of convex portions is processed, a light intensity distribution for exposure is different every pattern. The slight difference of the surface conditions (the difference in the fogging exposure value) in such a degree that will not be noticed by the developing of the resist pattern will affect as a difference in permeability of the resist pattern improving material to the resist pattern. As a result, it affects the formation of the mixing layer formed by the interaction between the resist pattern and the resist pattern improving material in terms of the easiness for the formation. When the entire surface of the resist pattern is exposed to the UV-ray or the ionizing radiation before the application of the resist pattern improving material, the surface conditions of the resist pattern are unified, and thus the permeability of the resist pattern improving material to the resist pattern can be unified without depending on the density or size of the resist pattern, which helps to effectively reduce the roughness of the side walls of the resist pattern, and to improve the uniformity of the resist pattern width.

The UV-ray and the ionizing radiation are appropriately selected depending on the sensitive wavelength range of the material of the resist pattern, without any restriction. Specific examples thereof include a broad band UV-ray emitted from a high pressure mercury lamp or low pressure mercury lamp, g-line (a wavelength of 436 nm), i-line (a wavelength of 365 nm), KrF excimer laser light (a wavelength of 248 nm), ArF excimer laser light (a wavelength of 193 nm), $F_2$ excimer laser light (a wavelength of 157 nm), EUV-ray (a soft X-ray region of a wavelength of 5 nm to 15 nm), an electron beam, and X-ray. Note that, among them, the one that is the same as the UV-ray or the ionizing radiation used for the exposure for forming the resist pattern is preferable in view of the structure of the production device.

The irradiance (the exposure dose) of the UV-ray or the ionizing radiation to the resist pattern is appropriately selected depending on the type of the UV-ray or the ionizing radiation for use without any restriction. For example, it is preferably 0.1% to 20% relative to the irradiance (the exposure dose) for the formation of the resist pattern.

When the irradiance is less than 0.1%, the surface conditions of the resist pattern may not be unified sufficiently. When the irradiance is more than 20%, the photoreaction is excessively induced in the resist pattern, and thus the upper portion of the resist pattern may be degraded in terms of the shape thereof, or the pattern may be partially lost.

The method for the exposure is not particularly restricted provided that the UV-ray or the ionizing radiation is applied at the constant irradiance in the range mentioned earlier. It is suitably adjusted and carried out in such a manner that the exposure of the strong light is carried out in a short period, the exposure of the weak light is carried out in a long period, the exposure to the highly sensitive resist material is carried out at the low exposure dose (irradiance), or the exposure to the resist material having low sensitivity is carried out at the high exposure dose (irradiance).

—Baking Step—

The baking step is baking (heating and drying) the applied resist pattern improving material during or after the application of the resist pattern improving material.

The baking efficiently induces the mixing (impregnation) of the resist pattern improving material to the resist pattern at the interface between the resist pattern and the resist pattern improving material. Note that, by applying the resist pattern improving material by spin coating, the solvent is removed and then a coating film of the resist pattern improving material is formed. In such the case, therefore, the baking may not be performed.

Note that, the condition, method, and the like of the baking (heating and drying) are appropriately selected depending on the intended purpose without any restriction, provided that the resist pattern is not softened by the baking. The number of the baking to be performed may be once, or twice or more. In the case where the baking is performed twice or more, the temperature of the baking may be constant or different each time. In the case where the temperature is constant, the temperature is preferably approximately 40° C. to approximately 150° C., more preferably 60° C. to 120° C., and the duration is preferably approximately 10 seconds to approximately 5 minutes, more preferably 30 seconds to 100 seconds.

The method for forming the resist pattern is suitably for forming various patterns (negative to resist patterns), such as a line-space pattern, a hole pattern (e.g. contact hole) and a trench (groove) pattern, and the resist pattern formed by the method for forming the resist pattern can be used as a mask pattern and a reticle pattern. Moreover, the method for forming the resist pattern can be suitably used for productions of metal plugs, various wirings, magnetic heads, liquid crystal displays (LCD), plasma display panels (PDP), functional parts such as a surface acoustic wave (SAW) filter, optical parts used for connections of optical wiring, precision parts such as a microactuator, and semiconductor devices. The method for forming the resist pattern is particularly suitably used in the method for producing a semiconductor device, which will be explained hereinafter.

(Method for Producing Semiconductor Device)

The method for producing a semiconductor device contains at least a resist pattern forming step, and a patterning step, and may further contain other steps, if necessary.

<Resist Pattern Forming Step>

The resist pattern forming step is, after forming a resist pattern on a processing surface, applying the resist pattern improving material so as to cover a surface of the resist pattern to thereby improve the resist pattern. As a result of the resist pattern forming step, a resist pattern in which the roughness of side walls of the resist pattern is reduced and uniformity of the resist pattern width is improved can be formed on the processing surface.

The details of the resist pattern forming step are the same as those of the method for forming a resist pattern.

Examples of the processing surface include surface layers of various members in a semiconductor device, but among them, a substrate or a surface of a substrate (e.g. silicon wafer), and various oxidized films are preferable. The processing surface is preferably an interlayer insulating material having dielectric constant of 2.7 or lower.

The resist pattern is as described earlier.

The coating method is as described earlier. Moreover, it is preferred that the baking be performed after the coating.

<Patterning Step>

The patterning step is etching the processing surface using the resist pattern formed in the resist pattern forming step as a mask (as a mask pattern) to pattern the processing surface.

The method of the etching is appropriately selected from methods known in the art depending on the intended purpose without any restriction, but it is preferably dry etching. The conditions of the etching are appropriately selected depending on the intended purpose without any restriction.

According to the method for producing a semiconductor device of this embodiment, various semiconductor devices, such as a flash memory, DRAM, and FRAM can be efficiently produced.

The disclosed resist pattern improving material can improve LWR of a resist pattern without changing the size of the resist pattern more than necessary.

The disclosed method for forming a resist pattern can attain a resist pattern whose LWR has been improved without changing the size of the resist pattern more than necessary.

The disclosed method for producing a semiconductor device can produce highly precise semiconductor device.

EXAMPLES

The present invention will be more specifically explained with reference to Examples, but these Examples shall not be construed as limiting to the scopes of the claims in any way.

Synthesis Example 1

Synthesis of Compound X

With reference to French Patent No. 1484640, the following monomer was synthesized in the manner explained as follow. A flask equipped with a stirrer and a thermal control unit was charged with 18.8 g (0.2 mol) of phenol, and 1.5 g (0.012 mol) of oxalic acid dehydrate, and the mixture was heated to 130° C. To this, 41.6 g (0.4 mol) of styrene was added, and the resulting mixture was allowed to react for 2 hours to thereby yield ($\alpha$-phenylethyl)phenol [monomer].

The obtained monomer was a mixture of monomers having different numbers of substitutions, and the proportions of each monomer in the mixture were: 30 mol % of 2-mono($\alpha$-phenylethyl)phenol, 65 mol % of 2,6-bis($\alpha$-phenylethyl)phenol, and 5 mol % of 2,4,6-tris($\alpha$-phenylethyl)phenol.

Next, with reference to JP-A No. 2008-45119, a stainless steel autoclave equipped with a stirrer and a thermal control unit was charged with 25.5 g of the monomer, and 0.29 g (0.08 mol %) of a 25% by mass tetramethyl ammonium hydroxide solution, and the mixture was dehydrated for 30 minutes at 100° C., under the reduced pressure of 4 kPa or lower. To this, 57.2 g (1.3 mol) of ethylene oxide (EO) was added dropwise over 180 minutes with maintaining the reaction temperature to 100° C., and then the resulting mixture was allowed to react for 180 minutes. Thereafter, the reaction mixture was maintained for 2 hours at 150° C. under the reduced pressure of 2.5 kPa or lower, to decompose and remove the remaining tetramethyl ammonium hydroxide, to thereby yield Compound X represented by the following formula.

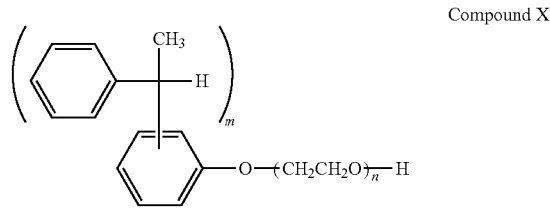

Compound X

As a result of the structural analysis of Compound X by MALDI-MS, it was found that m=1, 2, 3 (provided that, the abundance ratio of m was (m=2)>(m=1)>(m=3)), and n=5 to 25 (the abundance ratio of n was normal distribution, and the maximum peak was observed at n=12).

As a result of the measurement of the molecular weight by GPC, it was found that Compound X had the weight average molecular weight Mw of 1,190, and polydispersity Mw/Mn of 1.1.

Synthesis Example 2

Synthesis of Compound Y

Tridecyl alcohol (a mixture of isomers) (22.0 g) (0.11 mol) was used as a starting material, which was added to a stainless steel autoclave equipped with a stirrer and a thermal control unit, together with 1.0 g (0.26 mol %) of a 25% by mass tetramethyl ammonium hydroxide solution. The resulting mixture was dehydrated for 30 minutes at 100° C. under the reduced pressure of 4 kPa or lower. To this, a mixture of 46.2 g (1.05 mol) of ethylene oxide (EO) and 19.7 g (0.35 mol) of propylene oxide (PO) was added dropwise over 3 hours with maintaining the reaction temperature at 100° C., followed by stirring for 4 hours for allowing the mixture to react. Thereafter, the reaction mixture was maintained for 3 hours at 150° C. under the reduced pressure of 2.5 kPa or lower, to decompose and remove the remaining tetramethyl ammonium hydroxide, to thereby yield Compound Y represented by the following formula.

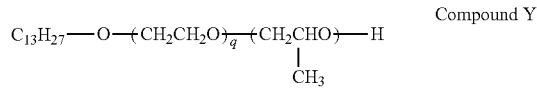

Compound Y

As a result of the structural analysis of Compound Y by MALDI-MS, it was found that the tridecyl groups contained isomer having a branched structure. Moreover, it was found that q=5 to 25 (the abundance ratio of q was normal distribution, and the maximum peak was observed at q=10), and r=1 to 4 (the abundance ratio of r was normal distribution, and the maximum peak was observed at r=3).

As a result of the measurement of the molecular weight by GPC, it was found that Compound Y had the weight average molecular weight Mw of 1,480, and polydispersity Mw/Mn of 1.1.

Example 1

Preparation of Resist Pattern Improving Material

The resist pattern improving materials a to p, and comparative materials A to C each having the formulation depicted in Table 1 were prepared using Compound X obtained in Synthesis Example 1, and Compound Y obtained in Synthesis Example 2.

In Table 1, the values within the brackets depicted in Table 1 represent formulated amounts (part(s) by mass).

In Table 1, "PVA" denotes polyvinyl alcohol (PVA-205C, manufactured by Kuraray Co., Ltd.), and "PVPd" denotes polyvinyl pyrrolidone (manufactured by Kanto Chemical Co., Inc.). In the column "Compound," X, and Y denote Compound X obtained in Synthesis Example 1, and Compound Y obtained in Synthesis Example 2, respectively. "2HBA" denotes 2-hydroxybenzyl alcohol (manufactured by Sigma-Aldrich Corporation), "PLA" denotes phenyl lactate (manufactured by Sigma-Aldrich Corporation), and "TN-80" denotes a nonionic surfactant (primary alcohol ethoxylate surfactant, manufactured by ADEKA CORPORATION).

Moreover, as the water, pure water (deionized water) was used, an amount of the water was adjusted to 100 parts by mass in each formulation.

TABLE 1

| Material | Water-soluble resin (parts by mass) | Compound (parts by mass) | Additive (1) (parts by mass) | Additive (2) (parts by mass) |
|---|---|---|---|---|
| a | PVA (1) | X (0.003) | PLA (0.01) | N/A |
| b | PVA (1) | X (0.003) | 2HBA (0.02) | N/A |
| c | PVPd (1) | X (0.003) | 2HBA (0.02) | N/A |
| d | PVA (1) | Y (0.003) | PLA (0.01) | N/A |
| e | PVA (1) | Y (0.003) | 2HBA (0.02) | N/A |
| f | PVPd (1) | Y (0.003) | PLA (0.01) | N/A |
| g | PVPd (1) | Y (0.003) | 2HBA (0.02) | N/A |
| h | PVA (0.5) | Y (0.003) | 2HBA (0.02) | N/A |
| i | PVA (1) | Y (0.01) | 2HBA (0.02) | N/A |
| j | PVA (1) | Y (0.001) | 2HBA (0.02) | N/A |
| k | PVA (1) | X (0.003) | N/A | N/A |
| l | PVA (1) | Y (0.003) | N/A | N/A |
| m | N/A | X (0.003) | N/A | N/A |
| n | N/A | Y (0.003) | N/A | N/A |
| o | N/A | X (0.003) | 2HBA (0.02) | N/A |
| p | N/A | Y (0.001) | 2HBA (0.02) | N/A |
| A | PVA (4) | N/A | 2HBA (1) | TN-80 (0.06) |
| B | PVA (1) | N/A | 2HBA (0.02) | TN-80 (0.003) |
| C | PVA (1) | N/A | 2HBA (0.02) | N/A |

—Formation of Resist Pattern—

The materials prepared (the resist pattern improving materials and comparative materials) in the aforementioned manner were each applied to a line-space pattern, which was formed of a alicyclic ArF resist (manufactured by TOKYO OHKA KOGYO CO., LTD.) and had a width of 96 nm (pitch: 180 nm) and LWR of 6.6 nm (corresponding to "unprocessed" in Table 2) by spin coating, initially at 850 rpm for 5 seconds, and then at 2,000 rpm for 40 seconds. Thereafter, baking was performed at 110° C. for 60 seconds, followed by rinsing the material with pure water for 60 seconds to remove unreacted portions in which interactions (mixing) did not occur. In this manner, a resist line pattern was formed using each of the resist pattern improving materials a to p, and comparative materials A to C.

A line width size of the obtained resist line pattern ("size after processing" in Table 2), changed amount in the size of the line width ("amount of change" in Table 2), variations in the line pattern width ("LWR" in Table 2) and an improvement rate of LWR (%) are presented in Table 2. In Table 2, "a" to "p" and "A" to "C" are corresponded to the resist pattern improving materials a to p and comparative materials A to C, respectively.

Note that, the line width is an average value of measured values of the line width at 6 points within the area observed by means of CD SEM. Moreover, LWR was obtained by tripling the standard deviation ($\sigma$) of the variation of the line width within the approximately 720 nm-length region. Furthermore, the ratio of the improved amount in the value of LWR after processing with respect to the value of LWR of the unprocessed patter was obtained from the following equitation, and this ratio was determined as "LWR improvement rate (%)".

LWR improvement rate(%)=[(LWR of unprocessed pattern−LWR after processing)/(LWR of unprocessed pattern)]×100

TABLE 2

| Material | Size after processing (nm) | Amount of change (nm) | LWR (nm) | LWR Improvement rate (%) |
|---|---|---|---|---|
| Unprocessed | 96 | N/A | 6.6 | N/A |
| a | 102 | 6 | 4.7 | 29 |
| b | 103 | 7 | 4.1 | 38 |
| c | 102 | 6 | 4.0 | 39 |
| d | 103 | 7 | 4.6 | 30 |
| e | 100 | 4 | 4.3 | 35 |
| f | 100 | 4 | 4.4 | 33 |
| g | 99 | 3 | 4.6 | 30 |
| h | 100 | 4 | 4.2 | 36 |
| i | 104 | 8 | 3.8 | 42 |
| j | 99 | 3 | 4.4 | 33 |
| k | 94 | −2 | 5.4 | 18 |
| l | 92 | −4 | 5.4 | 18 |
| m | 98 | 2 | 5.8 | 12 |
| n | 97 | 1 | 5.7 | 14 |
| o | 98 | 2 | 5.6 | 15 |
| p | 98 | 2 | 5.8 | 12 |
| A | 127 | 31 | 5.6 | 15 |
| B | 103 | 7 | 6.1 | 8 |
| C | 104 | 8 | 6.4 | 3 |

It can be confirmed from Table 2 that use of the resist pattern improving materials a to p improved the LWR, i.e. uniformity of the resist pattern width improved.

The comparative material A improved the LWR value, but the changed amount of the resist pattern was excessive, and the resist pattern was excessively thickened.

Example 2

Production of Semiconductor Device

Figure 2A:
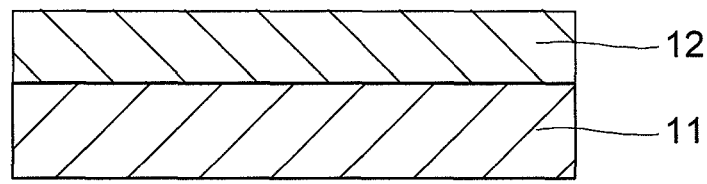
FIG. 2A is a schematic diagram for explaining one example of the method for producing a semiconductor device of the invention, and illustrates the state where an interlayer insulating film is formed on a silicon substrate.
Figure 2B:
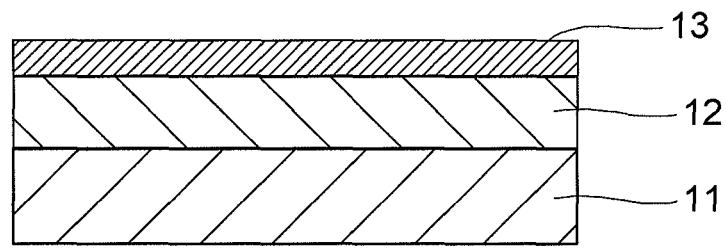
FIG. 2B is a schematic diagram for explaining one example of the method for producing a semiconductor device of the invention, and illustrates the state where a titanium film is formed on the interlayer insulating film of FIG. 2A.
Figure 2C:
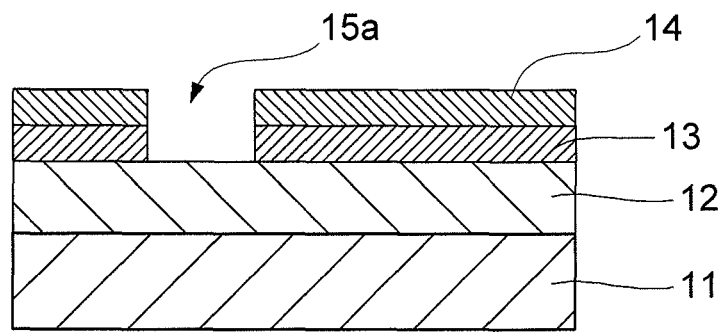
FIG. 2C is a schematic diagram for explaining one example of the method for producing a semiconductor device of the invention, and illustrates the state where a resist film is formed on the titanium film and a hole pattern is formed in the titanium film.
Figure 2D:
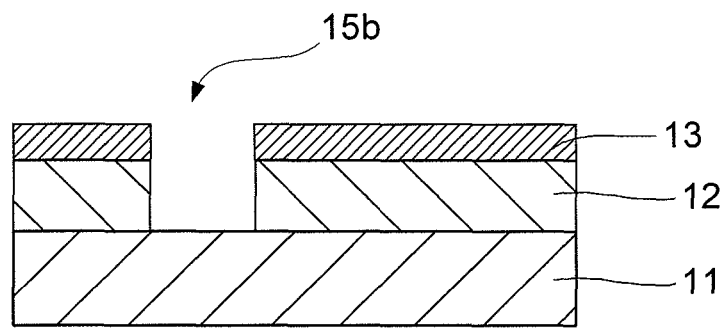
FIG. 2D is a schematic diagram for explaining one example of the method for producing a semiconductor device of the invention, and illustrates the state where a hole pattern is also formed in the interlayer insulating film.

An interlayer insulating film 12 was formed on a silicon substrate 11 as illustrated in FIG. 2A, and a titanium film 13 was formed on the interlayer insulating film 12 by sputtering as illustrated in FIG. 2B. Next, as illustrated in FIG. 2C, a resist pattern 14 was formed by double patterning, and the titanium film 13 was patterned, using the resist pattern as a mask, by reactive ion etching to form an opening 15a. Sequentially, an opening 15b was formed in the interlayer insulating film 12 using the titanium film 13 as a mask, as illustrated in FIG. 2D, as well as removing the resist pattern 14 by reactive ion etching.

Figure 2E:
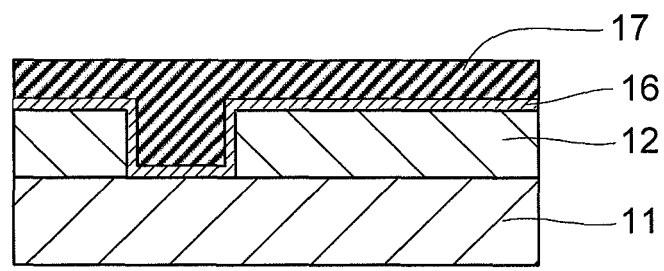
FIG. 2E is a schematic diagram for explaining one example of the method for producing a semiconductor device of the invention, and illustrates the state where a Cu film is formed on the interlayer insulating film in which the hole pattern has been formed.
Figure 2F:
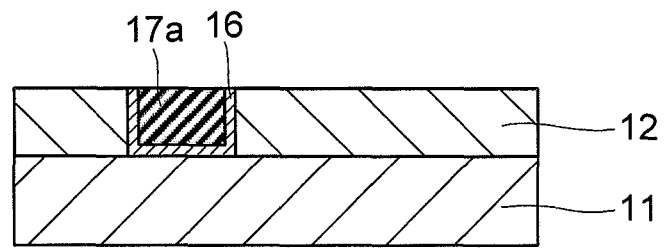
FIG. 2F is a schematic diagram for explaining one example of the method for producing a semiconductor device of the invention, and illustrates the state where the Cu deposited on the area of the interlayer insulating film where the hole pattern has not been provided is removed.

Next, the titanium film 13 was removed by a wet treatment, and a TiN film 16 was formed on the interlayer insulating film 12 by sputtering as illustrated in FIG. 2E, followed by forming a Cu film 17 on the TiN film 16 by electroplating. Thereafter, as illustrated in FIG. 2F, the surface was flattened by chemical-mechanical planarization (CMP) so as to leave the barrier metal and the Cu film (first metal film) in the groove corresponded to the opening 15b (FIG. 2D) to thereby form a first layer wiring 17a.

Figure 2G:
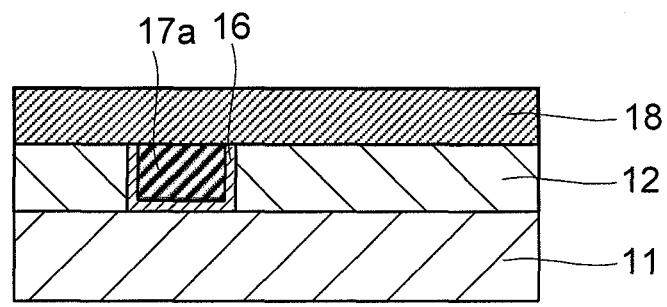
FIG. 2G is a schematic diagram for explaining one example of the method for producing a semiconductor device of the invention, and illustrates the state where an interlayer insulating film is formed on a Cu plug, which has been formed in the hole pattern, and on the interlayer insulating film.
Figure 2H:
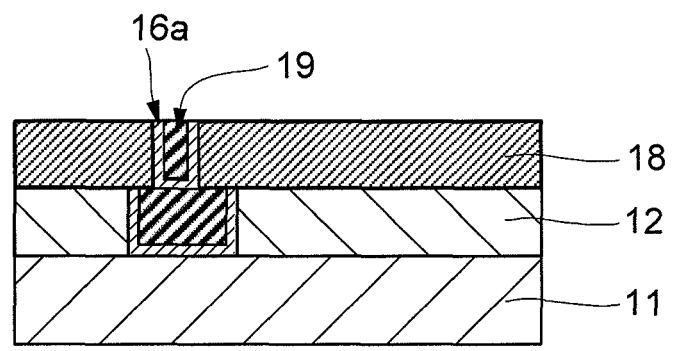
FIG. 2H is a schematic diagram for explaining one example of the method for producing a semiconductor device of the invention, and illustrates the state where a hole pattern is formed in the interlayer insulating film serving as a surface layer, and a Cu plug is formed.

Then, as illustrated in FIG. 2G, after forming an interlayer insulating film 18 on the first layer wiring 17a, as illustrated in FIG. 2H, a Cu plug (a second metal film) 19 for connecting the first layer wiring 17a with an upper layer wiring mentioned later, and a TiN film 16a were formed in the same manner illustrated in FIGS. 2A to 2F.

Figure 2I:
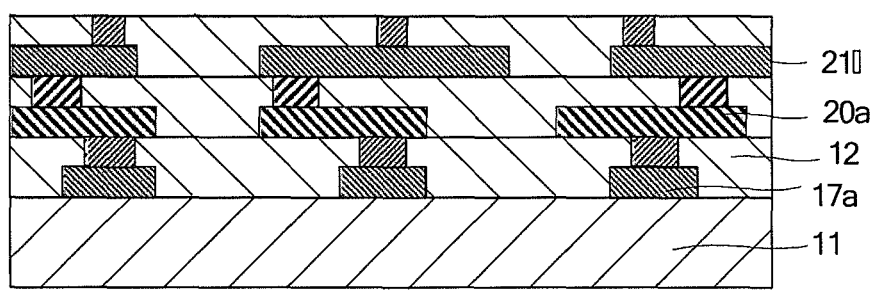
FIG. 2I is a schematic diagram for explaining one example of the method for producing a semiconductor device of the invention and illustrates the state where a wiring of three-layer structure is formed.

By repeating each steps, as illustrated in FIG. 2I, a semiconductor device having a multilayer-wiring structure including the first layer wiring 17a, the second layer wiring 20a and the third layer wiring 21a above the silicon substrate 11 was produced. Note that, in FIG. 2I, the barrier metal layer formed below each layer wiring is not illustrated.

In Example 2, the resist pattern 14 was a resist pattern formed by using the resist pattern improving material e of Example 1.

Moreover, the interlayer insulating film 12 was a low dielectric film having a dielectric constant of 2.7 or lower. Examples of such layer include a microporous silica film (CERAMATE NCS, manufactured by JCG Catalysts and Chemicals Ltd., dielectric constant: 2.25), and a fluorocarbon film (dielectric constant: 2.4) deposited and formed with a mixed gas of $C_4F_8$ and $C_2H_2$ or $C_4F_8$ gas as a source by RFCVD (power: 400 W).

Example 3

Production 2 of Semiconductor Device

An interlayer insulating film 12 was formed on a silicon substrate 11, as illustrated in FIG. 2A, and a titanium film 13 was formed on the interlayer insulating film 12 by sputtering, as illustrated in FIG. 2B. Next, a resist pattern 14 was formed as illustrated in FIG. 2C by ArF liquid immersion lithography, and using the resist pattern 14 as a mask, the titanium film 13 was patterned by reactive ion etching to form an opening 15a. Sequentially, as well as removing the resist pattern 14 by reactive ion etching, an opening 15b was formed in the interlayer insulating film 12 using the titanium film 13 as a mask, as illustrated in FIG. 2D.

Next, the titanium film 13 was removed by a wet treatment, and a TiN film 16 was formed on the interlayer insulating film 12 by sputtering as illustrated in FIG. 2E, followed by forming a Cu film 17 on the TiN film 16 by electroplating. Thereafter, as illustrated in FIG. 2F, the surface was flattened by chemical-mechanical planarization (CMP) so as to leave the barrier metal and the Cu film (first metal film) in the groove corresponded to the opening 15b (FIG. 2D) to thereby form a first layer wiring 17a.

Then, as illustrated in FIG. 2G, after forming an interlayer insulating film 18 on the first layer wiring 17a, as illustrated in FIG. 2H, a Cu plug (a second metal film) 19 for connecting the first layer wiring 17a with an upper layer wiring mentioned later, and a TiN film 16a were formed in the same manner illustrated in FIGS. 2A to 2F.

By repeating each steps, as illustrated in FIG. 2I, a semiconductor device having a multilayer-wiring structure including the first layer wiring 17a, the second layer wiring 20a and the third layer wiring 21a above the silicon substrate 11 was produced. Note that, in FIG. 2I, the barrier metal layer formed below each layer wiring is not illustrated.

In Example 3, the resist pattern 14 was a resist pattern formed by using the resist pattern improving material e of Example 1. Specifically, it was formed by applying the resist pattern improving material e to the resist pattern, which had been formed by the ArF liquid immersion lithography, followed by baking and rinsing with pure water to reduce the LWR value to thereby form the resist pattern 14.

Moreover, the interlayer insulating film 12 was a low dielectric film having a dielectric constant of 2.7 or lower. Examples of such layer include a microporous silica film (CERAMATE NCS, manufactured by JCG Catalysts and Chemicals Ltd., dielectric constant: 2.25), and a fluorocarbon film (dielectric constant: 2.4) deposited and formed with a mixed gas of $C_4F_8$ and $C_2H_2$ or $C_4F_8$ gas as a source by RFCVD (power: 400 W).

The disclosed resist pattern improving material is capable of improving the uniformity of the resist pattern width by reducing roughness of side walls of the resist pattern formed of an ArF resist, a resist for liquid immersion lithography, or the like; is suitably used for forming precise patterns by exceeding the exposure limit of light for use; and is suitably used in various patterning method, production methods of semiconductor devices, and the like. The disclosed resist pattern improving material is particularly suitably used in the disclosed method for forming a resist pattern, and the disclosed method for producing a semiconductor device.

The disclosed method for producing a semiconductor device is suitably used for productions of various semiconductor devices such as flash memories, DRAMs, FRAMs, and the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the sprit and scope of the invention.

What is claimed is:
1. A resist pattern improving material, comprising:
a compound represented by the following general formula (1), or a compound represented by the following general formula (2), or both thereof; and
water:

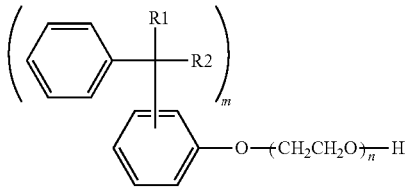

General Formula (1)

where R1 and R2 are each independently a hydrogen atom, or a C1-C3 alkyl group; m is an integer of 1 to 3; and n is an integer of 3 to 30, General Formula (2)

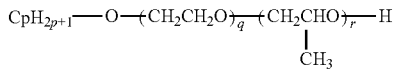

where p is an integer of 8 to 20; q is an integer of 3 to 30; and r is an integer of 1 to 8.

2. The material according to claim 1, wherein the alkyl group represented by $C_pH_{2p+1}$ in the general formula (2) is a branched alkyl group.

3. The material according to claim 1, further comprising a water-soluble resin.

4. The material according to claim 3, wherein the water-soluble resin is at least one selected from the group consisting of polyvinyl alcohol, polyvinyl acetal, polyvinyl acetate, polyvinyl pyrrolidone, and a resin containing any of the preceding resins at least in part thereof.

5. The material according to claim 1, further comprising a water-soluble compound containing an aromatic group, and having a molecular weight of 200 or smaller.

6. The material according to claim 5, wherein the water-soluble compound containing an aromatic group and having a molecular weight of 200 or smaller is at least one selected from the group consisting of mandelic acid, phenylalanine, phenylglycine, phenyl lactate, 2-hydroxybenzyl alcohol, 3-hydroxybenzyl alcohol, and 4-hydroxybenzyl alcohol.

7. A method for forming a resist pattern, comprising:
after forming a resist pattern, applying a resist pattern improving material so as to cover a surface of the resist pattern, and
rinsing the resist pattern, the surface of which has been covered with the resist pattern improving material, with a rinsing fluid containing pure water,
wherein the resist pattern improving material contains:
a compound represented by the following general formula (1), or a compound represented by the following general formula (2), or both thereof; and
water:

General Formula (1)

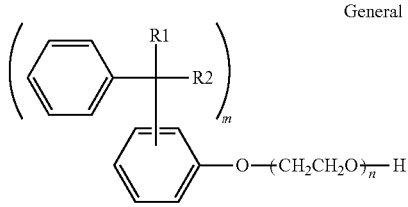

where R1 and R2 are each independently a hydrogen atom, or a C1-C3 alkyl group; m is an integer of 1 to 3; and n is an integer of 3 to 30, General Formula (2)

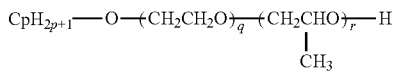

where p is an integer of 8 to 20; q is an integer of 3 to 30; and r is an integer of 1 to 8.

8. The method according to claim 7, wherein the alkyl group represented by $C_pH_{2p+1}$ in the general formula (2) is a branched alkyl group.

9. The method according to claim 7, wherein the resist pattern improving material further contains a water-soluble resin.

10. The method according to claim 9, wherein the water-soluble resin is at least one selected from the group consisting of polyvinyl alcohol, polyvinyl acetal, polyvinyl acetate, polyvinyl pyrrolidone, and a resin containing any of the preceding resins at least in part thereof.

11. The method according to claim 7, wherein the resist pattern improving material further contains a water-soluble compound containing an aromatic group, and having a molecular weight of 200 or smaller.

12. The method according to claim 11, wherein the water-soluble compound containing an aromatic group and having a molecular weight of 200 or smaller is at least one selected from the group consisting of mandelic acid, phenylalanine, phenylglycine, phenyl lactate, 2-hydroxybenzyl alcohol, 3-hydroxybenzyl alcohol, and 4-hydroxybenzyl alcohol.

13. A method for producing a semiconductor device, comprising:
after forming a resist pattern on a processing surface, applying a resist pattern improving material so as to cover a surface of the resist pattern to thereby improve the resist pattern; and
rinsing the resist pattern, the surface of which has been covered with the resist pattern improving material, with a rinsing fluid containing pure water,
etching the processing surface using the improved resist pattern as a mask so as to pattern the processing surface,
wherein the resist pattern improving material contains:
a compound represented by the following general formula (1), or a compound represented by the following general formula (2), or both thereof; and
water:

General Formula (1)

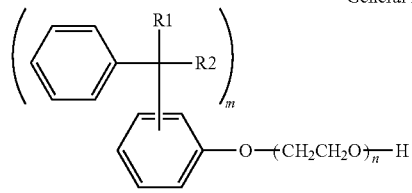

where R1 and R2 are each independently a hydrogen atom, or a C1-C3 alkyl group; m is an integer of 1 to 3; and n is an integer of 3 to 30, General Formula (2)

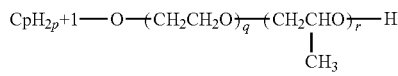

where p is an integer of 8 to 20; q is an integer of 3 to 30; and r is an integer of 1 to 8.

14. The method according to claim 13, wherein the processing surface is a surface of an interlayer insulating material having dielectric constant of 2.7 or lower.

15. The method according to claim 13, wherein the alkyl group represented by $C_pH_{2p+1}$ in the general formula (2) is a branched alkyl group.

16. The method according to claim 13, wherein the resist pattern improving material further contains a water-soluble resin.

17. The method according to claim 16, wherein the water-soluble resin is at least one selected from the group consisting of polyvinyl alcohol, polyvinyl acetal, polyvinyl acetate, polyvinyl pyrrolidone, and a resin containing any of the preceding resins at least in part thereof.

18. The method according to claim 13, wherein the resist pattern improving material further contains a water-soluble compound containing an aromatic group, and having a molecular weight of 200 or smaller.

19. The method according to claim 18, wherein the water-soluble compound containing an aromatic group and having a molecular weight of 200 or smaller is at least one selected from the group consisting of mandelic acid, phenylalanine, phenylglycine, phenyl lactate, 2-hydroxybenzyl alcohol, 3-hydroxybenzyl alcohol, and 4-hydroxybenzyl alcohol.

* * * * *